US010553470B2

United States Patent
Yue et al.

(10) Patent No.: US 10,553,470 B2
(45) Date of Patent: Feb. 4, 2020

(54) WAFER ALIGNMENT METHOD AND APPARATUS FOR OVERLAY MEASUREMENT

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Liwan Yue, Shanghai (CN); Qiang Wu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 157 days.

(21) Appl. No.: 15/715,051

(22) Filed: Sep. 25, 2017

(65) Prior Publication Data

US 2018/0122678 A1    May 3, 2018

(30) Foreign Application Priority Data

Oct. 31, 2016  (CN) .......................... 2016 1 0925898

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67265* (2013.01); *H01L 21/68707* (2013.01);
(Continued)

(58) Field of Classification Search
CPC ............. H01L 21/681; H01L 21/67265; H01L 21/68707; H01L 23/544;
(Continued)

(56) References Cited

U.S. PATENT DOCUMENTS 6,270,619 B1 * 8/2001 Suzuki .............. H01L 21/67161
118/719
9,059,037 B2   6/2015 Barash et al.
(Continued)

FOREIGN PATENT DOCUMENTS

| CN | 101286010 A | 10/2008 |
| CN | 103365095 A | 10/2013 |

(Continued)

OTHER PUBLICATIONS

European Patent Application No. 17198881.9, Extended European Search Report dated Jun. 18, 2018, 7 pages.
(Continued)

*Primary Examiner* — Maria E Vazquez Colon
(74) *Attorney, Agent, or Firm* — Kilpatrick Townsend & Stockton LLP

(57) ABSTRACT

A substrate alignment device includes a plurality of state detection units, each of which is configured to move from a standby position to a detection position for detecting a positional state of a substrate and return back from the detection position back to the standby position, and a multidimensional robot arm configured to receive and support the substrate, transfer the substrate to a substrate detection site, and adjust the substrate in at least one orientation or position according to the detected positional
(Continued)

state of the substrate to position the substrate to a target position for overlay mark measurements.

22 Claims, 9 Drawing Sheets

(51) Int. Cl.
    *H01L 21/687*     (2006.01)
    *H01L 23/544*     (2006.01)
    *G06T 7/13*     (2017.01)
    *B25J 9/16*     (2006.01)
    *G06T 7/00*     (2017.01)
    *H04N 5/225*     (2006.01)

(52) U.S. Cl.
    CPC ........... *H01L 23/544* (2013.01); *B25J 9/1697* (2013.01); *G06T 7/0006* (2013.01); *G06T 7/13* (2017.01); *G06T 2207/30148* (2013.01); *H01L 2223/54426* (2013.01); *H04N 5/2256* (2013.01); *Y10S 901/47* (2013.01)

(58) Field of Classification Search
    CPC ............. H01L 2223/54426; G06T 7/13; G06T 2207/30148; G06T 7/0006; B25J 9/1697; H04N 5/2256; Y10S 901/47
    See application file for complete search history.

(56) References Cited

U.S. PATENT DOCUMENTS

| | | | |
|---|---|---|---|
| 9,252,202 | B2 | 2/2016 | Piper |
| 2004/0261947 | A1* | 12/2004 | Haraguchi ............. H01L 24/75 |
| | | | 156/351 |
| 2009/0243413 | A1* | 10/2009 | Gilchrist .................. H02K 7/09 |
| | | | 310/90.5 |

FOREIGN PATENT DOCUMENTS

| | | |
|---|---|---|
| CN | 108010875 | 5/2018 |
| JP | 61184842 | 8/1986 |
| WO | 9964207 | 12/1999 |
| WO | 2004019135 | 3/2004 |
| WO | 2015135782 | 9/2015 |

OTHER PUBLICATIONS

Chinese Application No. 201610925898.2, Office Action dated Aug. 23, 2019, 6 pages.

\* cited by examiner

WAFER ALIGNMENT METHOD AND APPARATUS FOR OVERLAY MEASUREMENT

CROSS-REFERENCES TO RELATED APPLICATIONS

This application claims priority to Chinese patent application No. 201610925898.2, filed on Oct. 31, 2016, the content of which is incorporated herein by reference in its entirety.

FIELD OF THE INVENTION

The present invention relates generally to semiconductor technology. More particularly, embodiments of the present invention relate to a substrate alignment apparatus and a mark detection system including the substrate alignment apparatus.

BACKGROUND OF THE INVENTION

Conventional overlay measurement devices rely on optical imaging or scanning inspection to measure the relative positional deviation between two sets of marks. In general, it takes 0.5 to 1 second to position the marks to the center of the field of view of an optical imaging lens and take an image of the marks. With a continuous decrease in device feature sizes and an increase in overlay requirements, more data points need to be taken to improve accuracy of the measurements. It is important to calibrate the position of the wafer during the overlay measurements. It is therefore advantageous to calibrate the wafer position to ensure the accuracy of the overlay measurements.

BRIEF SUMMARY OF THE INVENTION

The present disclosure describes various embodiments that relate to devices, systems, and methods for cost effectively and time efficiently performing overlay measurements and wafer alignment.

In one embodiment, a substrate alignment device includes a plurality of state detection units each configured to move from a standby position to a detection position for detecting a positional state of a substrate and return back from the detection position back to the standby position; and a multidimensional robot arm configured to receive and support the substrate; transfer the substrate to a substrate detection site; and adjust the substrate in at least one orientation according to the detected positional state of the substrate to transport the substrate to a target position.

In one embodiment, the substrate is a semiconductor wafer; and the plurality of state detection units include at least one state detection unit configured to detect a position of an edge of the semiconductor wafer, and a remaining of the state detection units are configured to detect edges of the semiconductor wafer.

In one embodiment, the plurality of state detection units include four state detection units disposed at four vertices of a quadrilateral.

In one embodiment, each of the state detection units includes a photo sensor aligned with a portion of an edge of the substrate when the state detection units are in the detection position. In one embodiment, the photo sensor includes a light source for irradiating light onto the substrate and a light receiver for receiving light reflected from the irradiated substrate, and the photo sensors of the state detection units are disposed in a reference platform.

In one embodiment, the multidimensional robot arm is a six-degree-of-freedom arm configured to perform X-translation, Y-translation, Z-translation, X-Y plane rotation, X-tilt or Y-tilt operation of the substrate.

In one embodiment, the substrate alignment device further includes at least one rail structure comprising a pair of rails extending parallel to each other, at least one detection device operative to move along the at least one rail structure to perform a mark detection on the substrate and comprising an optical system; and adjust the substrate to the target position comprising at least one of the following operations: bring at least one portion of the substrate into a detection field of view of an optical system of the at least one detection device and bring at least one portion of the substrate within an imaging target area of the optical system.

In one embodiment, the multidimensional robot arm includes a support base for receiving and supporting the substrate; the at least one rail structure is disposed above the support base and spaced apart from the support base.

In one embodiment, the at least one rail structure includes a first rail and a second rail extending parallel to each other; a first slider and a second slider mounted on the detection device, the first slider being slidable along the first rail, and the second slider being slidable along the second rail, so that the at least one detection device is slidably movable over and traversing across the substrate.

In one embodiment, the at least one rail structure is an air cushion guide, and during operation, an air cushion is formed between the detection device and the air cushion guide.

In one embodiment, the at least one detection unit includes a first detection unit in an upper portion and a second detection unit in a lower portion of the at least one detection unit; and the at least one rail structure comprises a first rail structure extending along a first direction for the first detection unit and a second rail structure extending along a second direction for the second detection unit. In one embodiment, the first direction is perpendicular to the second direction.

In one embodiment, the first detection unit is mounted to the first rail structure in a hanging manner; and the second detection unit is mounted to the second rail structure in a mounting manner.

Embodiments of the present disclosure also provide a detection system. The detection system may include the above-described substrate alignment device, and at least one detection device configured to detect a plurality of marks on a surface of the substrate, the marks each comprising a first stripe group and a second stripe group disposed parallel to each other. In one embodiment, the at least one detection device includes at least one detection module operative to move over and traverse across the surface of the substrate in one direction and to obtain information from a corresponding mark, the at least one detection device operative to perform repeated acquisition operations on the first stripe group and the second stripe group of the corresponding mark to obtain data therefrom; and at least one positioning unit configured to position the at least one detection module to align with the corresponding mark.

In one embodiment, the first strip group may include a plurality of first stripes spaced apart from each other, the second strip group may include a plurality of second stripes spaced apart from each other; and the first and second stripes are disposed in the one direction. In one embodiment, the first and second stripes are disposed alternatively to each other and spaced apart from each other.

In one embodiment, the detection system further includes a data processing module coupled to the at least one detection device and configured to determine a deviation of a relative position between the first stripe group and the second stripe group based on the data obtained from the first stripe group and the second stripe group of the corresponding mark.

In one embodiment, the obtained data includes one of a light intensity received from first stripe group or the second stripe group, and a time corresponding to the received light intensity; and the data processing module is further configured to: determine a peak light intensity based on the received light intensity; determine a time of occurrence of a current stripe based on the peak light intensity; determine a moving speed of the detection module based on a total length of the first stripe group or second stripe group and a total time that the detection module traverses from a first strip to a last stripe of the first stripe group or the second stripe group; and determine a position of the first stripe group and a position of the second stripe group and a positional difference between the first and second stripe groups based on the moving speed and the time of occurrence of the current stripe.

In one embodiment, the substrate includes a plurality of columns of the marks arranged in the one direction; the at least one detection unit includes a plurality of detection units; the at least one positioning unit comprises a plurality of positioning units, each of the positioning units being configured to drive one of the detection units to align the one of the detection units with a corresponding mark.

In one embodiment, the at least one detection module includes a frame; and the at least one positioning unit includes at least one support rod fixedly mounted on the frame and configured to support the at least one detection unit; and a positioning structure configured to move a corresponding detection unit along the least one support rod to fix the corresponding detection unit at a desired position to align the corresponding detection unit with the corresponding mark.

In one embodiment, the at least one support rod includes a screw rod; and the positioning structure drives the corresponding detection unit by the screw rod to move along the at least one support rod.

In one embodiment, the at least one detection unit includes first and second holes arranged vertically with respect to each other and a third hole disposed between the first and second holes, the third hole having internal threads, and the screw bar having external threads for engaging the internal threads of the third hole. The frame includes a first bracket and a second bracket disposed opposite to each other. The at least one support rod includes a first support rail passing through the first hole and a second support rail passing through the second hole and suspended between the first and second brackets; and the screw rod passing through the third hole drives the at least one detection unit along the first and second support rails when rotated The following description, together with the accompanying drawings, will provide a better understanding of the nature and advantages of the claimed invention.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Figure 1:
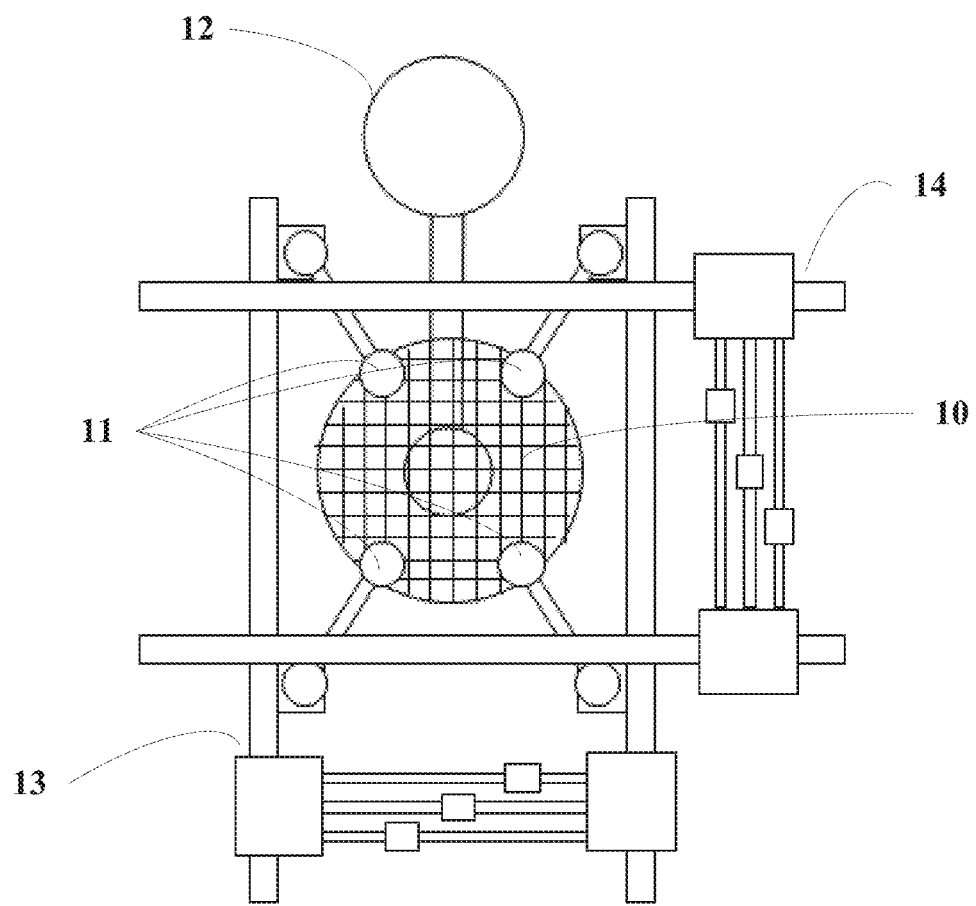
FIG. 1 is schematic diagram illustrating a wafer alignment apparatus (substrate alignment device) according to one embodiment of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be noted that the reference numerals and letters denoted similar items in the accompanying drawings, and therefor, once an item is defined in a drawing, its description will not be repeated in drawings that follow.

As used herein, the terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process may have been utilized to form regions or junctions in the base semiconductor structure or foundation. In addition, the semiconductor need not be silicon-based, but could be based on silicon-germanium, germanium, or gallium arsenide. The term "substrate" may include any structure having an exposed surface with which to form an integrated circuit. The term "substrate" may also refers to semiconductor structures during processing and may include other layers that have been fabricated thereupon. The term "wafer" and "substrate" may be used alternatively. The term "apparatus" and "device" may be used alternatively.

FIG. 1 is schematic diagram illustrating a wafer alignment apparatus according to one embodiment of the present disclosure. Referring to FIG. 1, the wafer alignment apparatus (alternatively referred to as substrate alignment device) may include a plurality of state detection units 11 and a multidimensional (multi-directional movement) robot arm 12. State detection units 11 each can move from a standby position to a detection position to detect a positional state of wafer 10 and return from the detection position back to the standby position.

Multidimensional robot arm 12 is configured to receive and support wafer 10, transfer wafer 10 to a wafer detection site, and adjust wafer 10 in at least one orientation according to a positional state of wafer 10 detected by one of state detection units 11, so that the wafer is in a target position.

It should be noted that the above-described position state may include a location and a position of the wafer (substrate) and/or the degree of inclination of the substrate. The above-described target position refers to a position state in which a desired location in a desired position of the substrate is better suited (a suitable or appropriate position) for an overlay (mark) measurement.

In the above-described embodiment, the position state of the substrate is calibrated through the collaboration (cooperation) of the state detection unit and the multidimensional robot arm to adjust the substrate to the target position, so that the calibration of the substrate can be performed more quickly to enable subsequent overlay measurements. The above-described embodiment provides the advantages of high efficiency and high speed by using the robot arm to directly calibrate and/or adjust the substrate. This direct substrate calibration using the robot arm ensures, to a certain extent, the overly measurement accuracy in subsequent overlay operations.

In one embodiment, a control unit that is electrically connected to state detection units 11 may be provided in multidimensional robot arm 12. Alternatively, a control unit may be electrically connected to state detection units 11 and to multidimensional robot arm 12, respectively. The control unit receives the position state of substrate 10 from state detection units 11 and controls multidimensional robot arm 12 in association with a pre-stored target position to adjust the substrate to the target position.

In one embodiment, substrate 10 may be a semiconductor wafer. At least one of the state detection units is configured to detect the position of an edge of the wafer and the remaining of the state detection units are configured to detect an edge of the wafer (e.g., a peripheral portion of an edge of the wafer).

In one embodiment, referring to FIG. 1, state detection units 11 may include four state detection units. The four state detection units are disposed at the four vertices of a quadrilateral, respectively. The four state detection units can be controlled by four rotary motors (rotary engines), respectively. When the substrate is transported into the substrate detection site, the four state detection units are moved to the top of the substrate to detect the four corner portions of the substrate.

For example, each of state detection units 11 may include a photoelectric sensor (alternatively referred to as photo sensor) that is aligned with a portion of an edge of the substrate when the state detection units are in the detection position. For example, the photoelectric sensor may include a light source and an optical receiver. The light source is configured to emit light onto substrate 10, and the light receiver is configured to receive light reflected from substrate 10 to detect an edge position of the substrate. The photoelectric sensors of the state detection units are disposed in a reference platform with high precision. For example, the four state detection units and the overlay measurement sensors can be adjusted to the same height. In another embodiment, the state detection units each may include a sensor configured to calibrate the focal length, the level and position of the photoelectric sensor.

In one embodiment, referring to FIG. 1, the substrate alignment device may further include a guide rail structure including a pair of guide rails that extend parallel to each other and are spaced apart from each other. Two guide rail structures, such as a first guide rail structure 13 and a second guide rail structure 14, are shown in FIG. 1. Those of skill in the art will appreciate that the number of guide rail structures may be fewer than or greater than two, and the scope of the invention is not limited thereto. The guide rail structure will be described in more detail below.

In one embodiment, the substrate alignment device may further include a detection device (not shown) configured to move along at least one guide rail structure to detect the substrate. The detection device may include an optical detection system. The above-described mechanisms to position the substrate to the target position may include at least one of the following: positioning (placing) a portion of the substrate in the detection field of the optical system, and positioning (placing) at least a portion of the substrate in the imaging target area of the optical system. It should be noted that the imaging target area refers to an area in which the surface of the substrate to be detected can be clearly imaged by the optical system (i.e., in the image plane of the optical system). In the embodiment, the detection device may be configured to enable overlay (mark) measurements. In some embodiments, the detection device may utilize conventional overlay measurement devices known in the art. In some other embodiments, the detection device may utilize a novel detection device of the present invention that will be described in detail later below.

Figure 2:
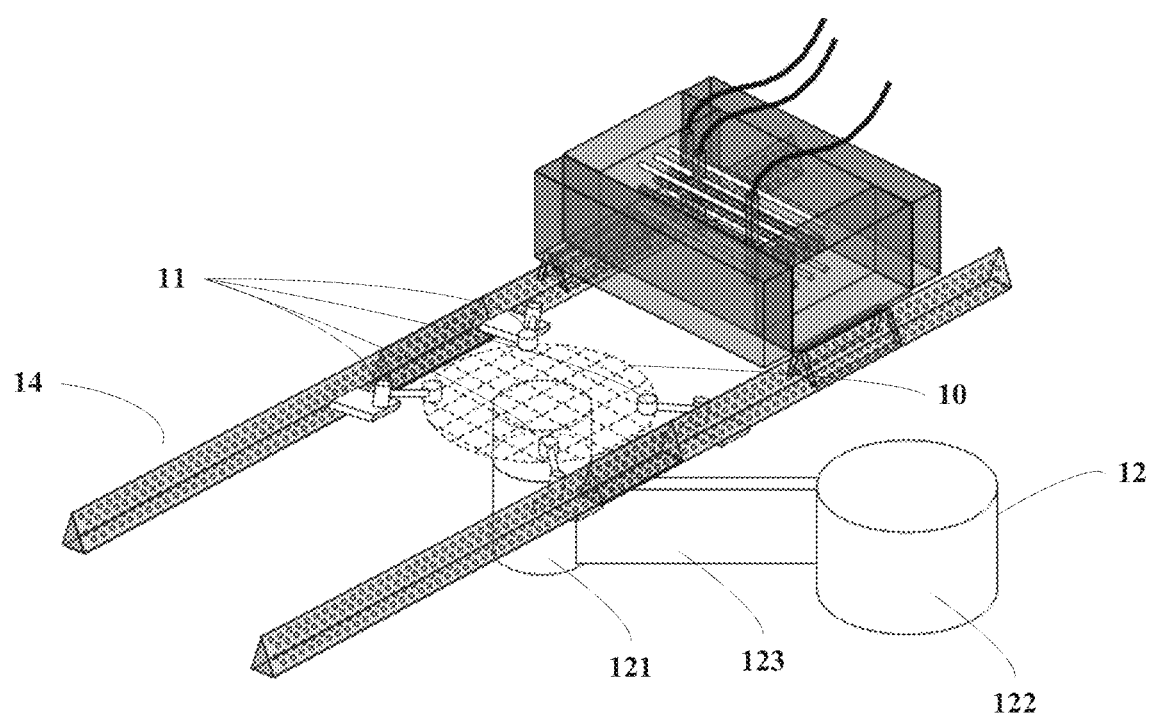
FIG. 2 is a perspective view illustrating a wafer alignment apparatus according to one embodiment of the present disclosure.

FIG. 2 is a perspective view illustrating a wafer alignment apparatus (substrate alignment device) according to one embodiment of the present disclosure.

In one embodiment, referring to FIG. 2, multidimensional robot arm 12 may include a support base 121 configured to receive and support substrate 10. The at least one guide rail structure (e.g., guide rail structure 14) is disposed above support base 121 and spaced apart from the support base. Multidimensional robot arm 12 may further include a rotation shaft 122 and a connecting arm 123 connecting rotation shaft 122 to support base 121.

Multidimensional robot arm 12 may be a six-degree-of-freedom robot arm configured to perform X-translation, Y-translation, Z-translation, X-Y plane rotation, X-tilt, or Y-tilt adjustment of substrate 10. For example, the adjustment of the six degrees of freedom can be achieved by operating support base 121 and rotation shaft 122. It is to be noted that "X-translation" refers to the lateral translation of the substrate in the X-axis direction, "Y-translation" refers to the lateral translation of the substrate in the Y-axis direction, "Z-translation" refers to the lateral translation of the substrate in the Z-axis direction, "X-Y plane rotation" refers to the rotation of the substrate in the X-Y plane with the Z-axis as the rotation axis, "X-tilt" refers to tilting the substrate up and down on the X-Y plane with the Y-axis as the rotation axis, "Y-tilt" refers to tilting the substrate up and down on the X-Y plane with the X-axis as the rotation axis. With the operation of the multidimensional robot arm, it is possible to adjust the translation, rotation, level and focus of the substrate.

Figure 3:
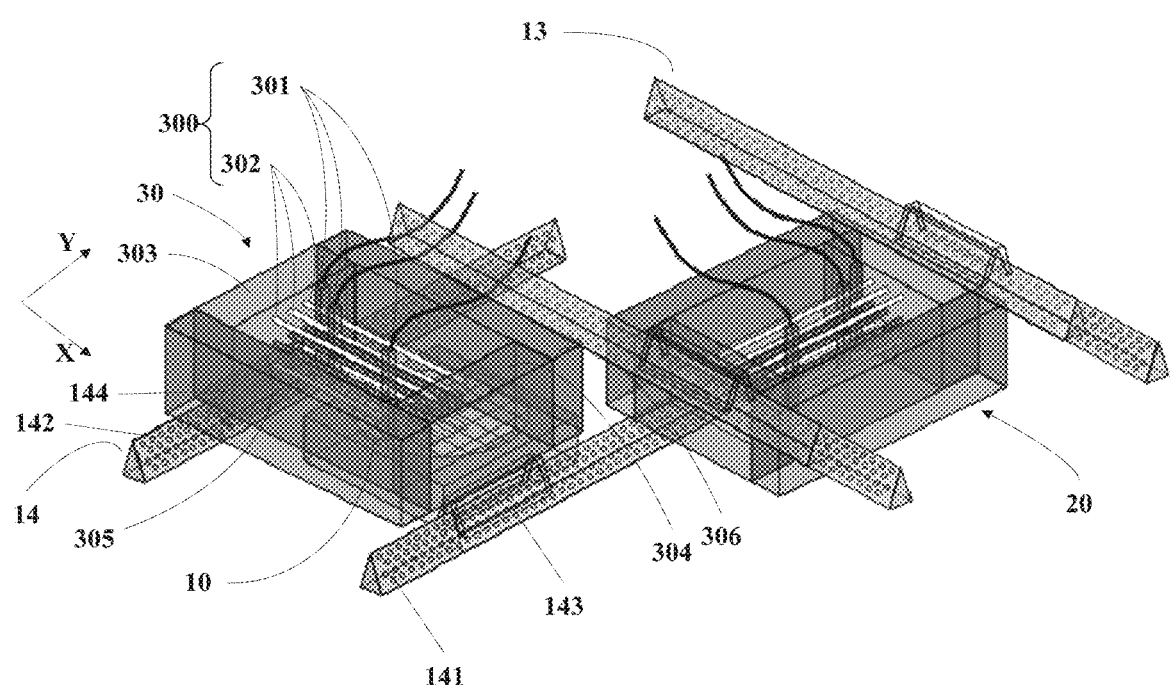
FIG. 3 is a perspective view illustrating a partial structure of a wafer alignment apparatus according to another embodiment of the present disclosure.

FIG. 3 is a perspective view illustrating a partial structure of a substrate alignment device according to one embodiment of the present disclosure. FIG. 3 illustrates at least one detection device and at least one guide rail structure (alternatively referred to as rail structure). Referring to FIG. 3, the at least one detection device may include a first detection device 20 disposed at an upper portion and a second detection device 30 disposed at a lower portion of the at least one detection device. The at least one guide rail structure may include a first guide rail structure 13 extending in the first direction (e.g., the X direction) for first detection device 20 and a second guide rail structure 14 extending in the second direction (e.g., the Y direction) for second detection device 30. In one exemplary embodiment, the first direction is perpendicular to the second direction.

In one embodiment, first detection device 20 is slidably supported by first guide rail structure 13 in a hanging manner, and second detection device 20 is slidably supported by second guide rail structure 14 in a mounting manner. This arrangement will save space and reduce the size of the device. In another embodiment, first detection device 20 and second detection device 30 may be supported on first rail structure 13 and second rail structure 14 in a mounting manner, respectively. Alternatively, first detection device 20 and second detection device 30 may be supported by first rail structure 13 and second rail structure 14 in a hanging manner, respectively.

The at least one rail structure will be described in detail below with reference to second rail structure 14 and an example.

Referring to FIG. 3, second rail structure 14 may include a first rail 141, a second rail 142, a first slider 143, and a second slider 144. First rail 141 and second rail 144 extend parallel to each other in a same extension direction (e.g., the Y direction). First slide 143 and second slider 144 are fixedly mounted to a detection device (e.g., second detection device 30). First slide 143 is slidably movable along first trail 141, and second slide 144 is slidably movable along second trail 142, so that the detection device (e.g. second detection device 30) can move in the extension direction (e.g., the Y direction) over and traverse across substrate 10. In one example embodiment, the rail structure may be an air cushion guide, and during operation, an air cushion is formed between the detection device and the air cushion guide. It is noted that the structure of first rail structure 13 is similar to that of second rail structure, and therefore, the first rail structure will not be described herein for the sake of brevity.

In some embodiments, the multidimensional robot arm transports the substrate below the rail structure into the substrate detection site, which prevents the movement of the measurement platform from being blocked by the state detection unit and the multidimensional robot arm.

The present disclosure also provides a detection system that may include the above-described substrate alignment device. The present disclosure also provides a detection system that may include a detection device that will be described later below. The detection device is configured to detect a plurality of marks on the surface of the substrate. Each of the marks may include a first stripe and a second stripe that are substantially parallel to each other and spaced apart form each other. The detection device may include at least one detection module.

Second detection device 30 and the detection device will be described in detail with reference to FIG. 3 according to one embodiment of the present disclosure. In the embodiment, substrate 10 may include a plurality of columns of marks arranged in a certain direction (e.g., the Y direction), each column of marks may include a first stripe group and a second stripe group that are substantially parallel to each other and spaced apart from each other (the mark will be described in detail later with reference to FIG. 4). Referring to FIG. 3, a detection module 300 may include at least one mark detection unit 301 (e.g., the at least one mark detection unit may include a multitude of mark detection units) and at least one positioning unit 302 (e.g., the at least one positioning unit may include a multitude of positioning units). The mark detection unit and the positioning unit will be described in detail later with reference to FIG. 5. Each of the positioning units 302 can be driven so that a corresponding mark detection unit 301 is aligned with a corresponding mark in the direction of the movement of the mark detection unit (e.g., in the Y direction as shown in FIG. 3).

In the embodiment, the mark detection unit can be aligned with a column of marks by the positioning unit, so that detection module 300 can detect multiple columns of marks when moving on and passing over the surface of substrate 10 in the Y direction, thereby further reducing the detection time and improving the efficiency of the mark detection.

It is understood that the number of mark detection units and positioning units can be any integer number. In the example shown in FIG. 3, three mark detection units 301 and three positioning units 302 are shown. But it is understood that the number is arbitrary chosen for describing the example embodiment and should not be limiting. In practical applications, the number of mark detection units and positioning units can be determined according to actual requirements.

The detection device may include a plurality of detection modules 300, e.g., two detection modules. One of the detection modules may be configured to detect a mark in one direction (e.g., the Y direction), and the other detection module may be configured to detect a mark in another direction (e.g., the X direction). In the case where a plurality of columns of marks are disposed in both the X direction and the Y direction, one scanning in the X direction can detect all of the marks disposed in the X direction, and one scanning in the Y direction can detect all of the marks disposed in the Y direction. For example, if the scanning speed is 1 m/s, the time to scan through a 300 mm substrate is slightly greater than 0.3 seconds. The time to completely scanning the marks in both X and Y directions is only about 1 second, which significantly reduces the mark detection time.

In one embodiment, referring to FIG. 3, detection module 300 may also include a frame. The detection unit and the positioning unit may be directly or indirectly mounted on or supported by the frame. In one embodiment, the frame may include a first bracket 303 and a second bracket 304 disposed opposite to each other. In another embodiment, the frame may include first bracket 303, second bracket 304, a third bracket 305, and a fourth bracket 306. Third bracket 305 and fourth bracket 306 are disposed opposite to each other and arranged in a certain direction (e.g., the Y direction). Third bracket 305 is engaged with a first end of first bracket 303 and a first end of second bracket 304, and fourth bracket 306 is engaged with a second end of first bracket 303 and a second end of second bracket 304. The first ends and the second ends of the first and second brackets are opposite to each other. The frame is configured to increase the weight of the detection device, thereby increasing the inertia of the detection device in motion, and to secure the positioning unit to a support rod (that will described in detail later below).

Figure 4:
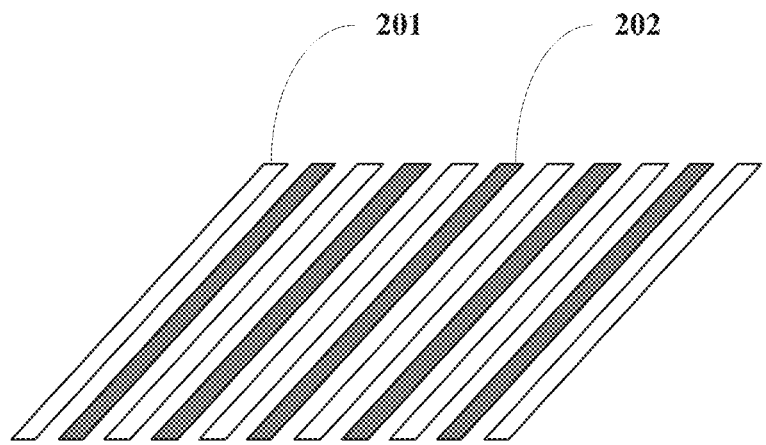
FIG. 4 is a perspective view illustrating a mark on a wafer according to one embodiment of the present disclosure.

FIG. 4 is a perspective view of a mark on a substrate according to one embodiment of the present disclosure. As shown in FIG. 4, the mark on the substrate may include a plurality of first stripes (first stripe group) 201 and a plurality of second stripes (second stripe group) 202 that are substantially parallel to each other and spaced apart from each other. In one embodiment, first stripes 201 may be the overlay mark stripes of the current layer, and second stripes 202 may be the overlay mark stripes of a previous layer. That is, first stripes 201 may be formed in a first layer, and second stripes 202 may be formed in a second layer that is different from the first layer. Thus, it is understood that, although the first and second overlay mark stripes are shown to be substantially flush for the convenience of illustration in FIG. 4, the first and second overlay mark stripes (alternatively referred to as first and second stripes) can be disposed in different levels according to certain embodiments. Illustratively, first stripes 201 and second stripes 202 may be a concave-convex pattern formed in corresponding layers. Further, in some embodiments, the first and second stripes may be configured to have different properties. In one example embodiment, the first and second stripes may be configured to have different surface reflectivity, such that one of the first and second stripes has a relatively smooth surface and the other one of the first and second stripes has a relatively rough surface. In another example embodiment, the first and second stripes may be configured to have different surface heights. It is to be understood that these are merely examples in order to better understand the various embodiments of the disclosure and are not intended to limit the scope of the disclosure, as long as the difference between the first and second stripes is distinguishable using any technical means (e.g., through information or data obtained from the stripes). In some other embodiments, the mark on the substrate may include a first group of stripes (a first stripe group) spaced apart from each other and a second group of stripes (a second stripe group) spaced apart from each other, as shown in FIG. 4. Herein, the first group of stripes (the first stripe group) may include a plurality of first stripes adjacent to each other, and the second group of stripes (the second stripe group) may include a plurality of second stripes adjacent to each other. The first group of stripes and the second group of stripes are arranged parallel to each other along a certain direction. In one embodiment, first stripes 201 and second stripes 202 are disposed alternatively to each other (as shown in FIG. 4), however, the present disclosure is not limited thereto.

Figure 5:
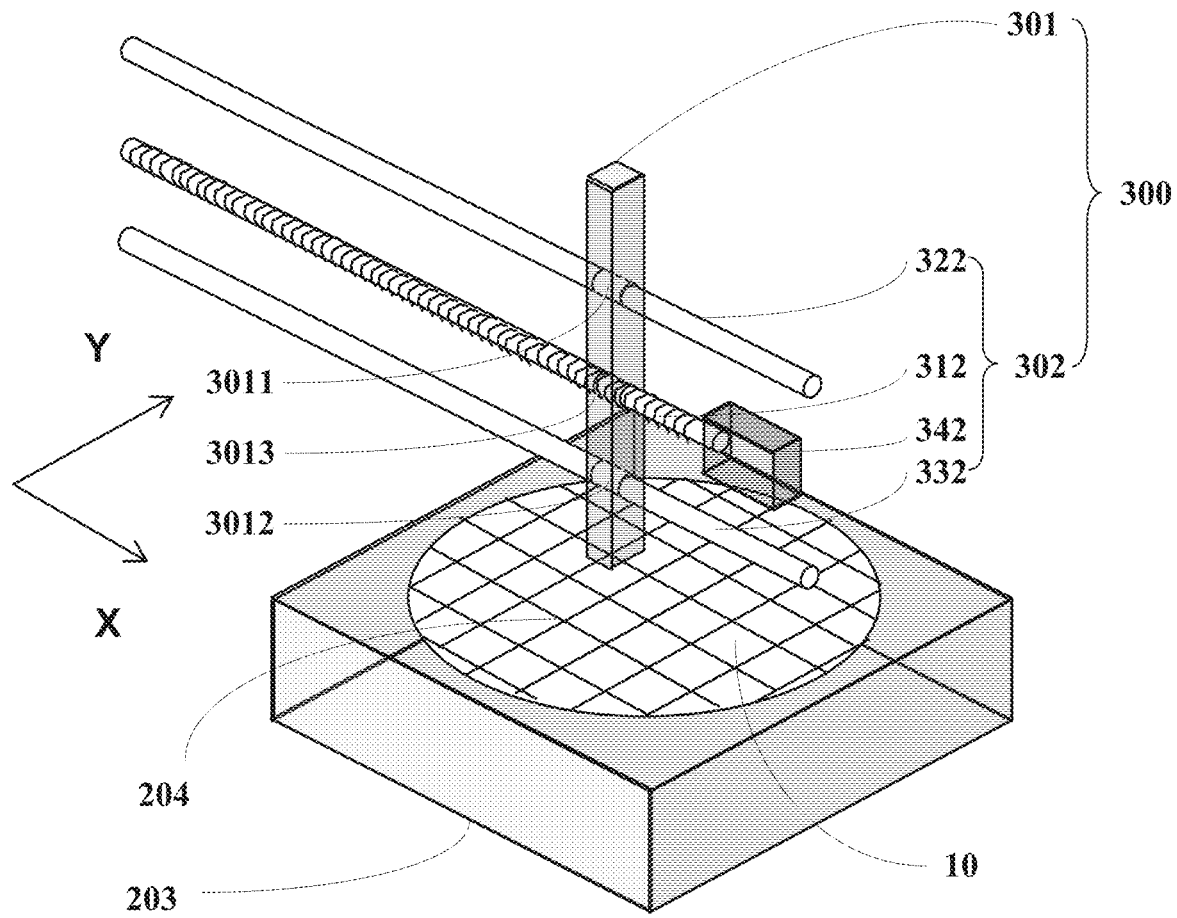
FIG. 5 is a perspective view illustrating a mark detection unit and a positioning unit according to one embodiment of the present disclosure.

FIG. 5 is a perspective view illustrating a structure of a mark detection unit and a positioning unit according to an embodiment of the present disclosure. As used herein, the mark on the surface of substrate 10 may include the stripes described above with reference to FIG. 4. Referring to FIG. 5, the detection device (alternatively referred to detection apparatus) may include at least one detection module 300. Detection module 300 is configured to be moveable over and traverse across the surface of substrate 10 along at least one direction (e.g., along the Y-direction). In some embodiments, the detection apparatus may include two detection modules, one of which is configured to be moveable over and traverse across the surface of substrate 10 along the X-direction, the other one is configured to be moveable over and traverse across the surface of substrate 10 along the Y-direction. Substrate 10 is shown as being supported by a substrate support platform 203. Substrate support platform 203 may be any suitable platform for supporting or carrying a substrate known in the art or developed in the future.

Detection module 300 may include at least one detection unit 301 and at least one positioning unit 302. Detection unit 301 is configured to obtain information (data) of a corresponding mark (e.g., as shown in FIG. 4). In the example embodiment shown in FIG. 5, the mark may be disposed in a track 204 on substrate 10. Track 204 may be a scribe line of a semiconductor substrate (wafer), the mark may be an overlay mark imprinted on or etched in the scribe line. Track 204 is shown to be extending along the X-direction or the Y-direction. Of course, it should be understood that track 204 is merely an example, those of skill in the art will appreciate that track 204 may not be present or a virtual line.

Detection unit 301 is configured to perform repeated acquisition operations on a first stripe group (i.e., first stripes 201) and a second stripe group (i.e., second stripes 202) of a corresponding mark. Each acquisition operation may obtain information (data) of the first stripe group or the second stripe group of the corresponding mark. In one embodiment, the obtained data of the mark may include at least one of the peak light intensity received from the first stripe group or the second stripe group and the time at which the peak light intensity is received. For example, the peak light intensity can be determined based on the received light intensity, and then the time at which the current stripe occurs can be determined according to the peak light intensity and the corresponding time, and then the speed of the detection module can be determined by dividing the total length (from the first stripe to the last stripe of the first stripe group or the second stripe group) of the mark by the total time required for the detection module to traverse across the total length of the mark, the positions of the first stripe group and the second stripe group and the positional difference between the first and second stripe groups can thus be determined.

Positioning unit 302 is configured to support and position a corresponding detection unit 301. Positioning unit 302 is configured to operate such that corresponding detection unit 301 is substantially aligned with a corresponding alignment mark in the X or Y direction of the detection module. Positioning unit 302 will be described in more detail later below.

According to the present disclosure, the detection unit may be substantially aligned with a corresponding mark (e.g., overlay mark) to be detected by the positioning unit, and the detection module is moved above the substrate to obtain data of the corresponding mark. This approach of mark detection does not rely upon an optical imaging approach, and thus, no operation of moving the mark to the center of the field of view of the optical imaging system is required, there is no need for a fine tuning operation, and there is no need to identify the optical image, which reduces the mark detection time, and this approach of the present disclosure does not require high precise alignment accuracy required in the prior art. Thus, the cost of mark detection is reduced, and the efficiency of the mark detection and the throughput of the detection device are improved.

Further, in some embodiments, the detection device may include a data processing module (not shown) connecting to the detection modules through a wired or wireless connection link to receive and process data of the first and second stripe groups to determined the positional difference between the first and second stripe groups. The data processing module may be integrated in the detection device (e.g., in the form of a processor). In another embodiment, the data processing module may be an individual component, such as a computing device remote from the detection module and connected to the detection module (detection device) through a wired or wireless communication link.

Referring still to FIG. 5, positioning unit 302 may include at least one (e.g., two or three) support rod and a positioning mechanism 342. The support rod may be mounted or partially mounted on the frame (e.g., on the first bracket and/or the second bracket) and configured to support a corresponding detection unit 301. Positioning mechanism 342 is configured to move corresponding detection unit 301 along the support rod that secures the detection unit in a desired position so that the detection unit is aligned with a corresponding mark in a certain direction (e.g., the Y direction). In one embodiment, the support rod may include a screw rod 312, and positioning mechanism 342 may be driven by screw rod 312 to move detection unit 301 along screw rod 312. For example, the screw rod may have a positioning accuracy of 0.01 mm. In one embodiment, positioning mechanism 342 may be a rotating motor that can drive the screw rod to properly position detection unit 301.

In practical applications, the detection unit and the positioning unit may be implemented using different approaches so that the positioning unit can cause the corresponding detection unit to be aligned with a corresponding mark in a certain direction (e.g., the Y direction).

In one embodiment, referring still to FIG. 5, detection unit 301 may include a first hole 3011 disposed in a first vertical position and a second hole 3012 disposed in a second vertical position with regard to the first vertical position, and a third hole 3013 disposed between first hole 3011 and second hole 3012. Third hole 3013 has an internal thread, and screw rod 312 has an external thread engaging the internal thread of third hole 3013. In the embodiment, the frame may include first bracket 303 and second bracket 304 opposite to each other (shown in FIG. 3). The support rod may include screw rod 312, a first support rail 322, a second support rail 332, and positioning mechanism 342. First support rail 322 and second support rail 332 pass through respective first hole 3011 and second hole 3012 and are suspended between first bracket 303 and second bracket 304. In one embodiment, first support 322 and second support rail 332 may be engaged with detection unit 301 using a sliding bearing so that detection unit 301 can be moved along the support rail. Screw rod 312 passes through third hole 3013 so as to enable detection unit 301 to move along first support rail 322 and second support rail 332 when screw rod 312 is rotated to cause detection unit 301 to align with a corresponding mark in a certain direction (e.g., the Y direction).

Figure 6:
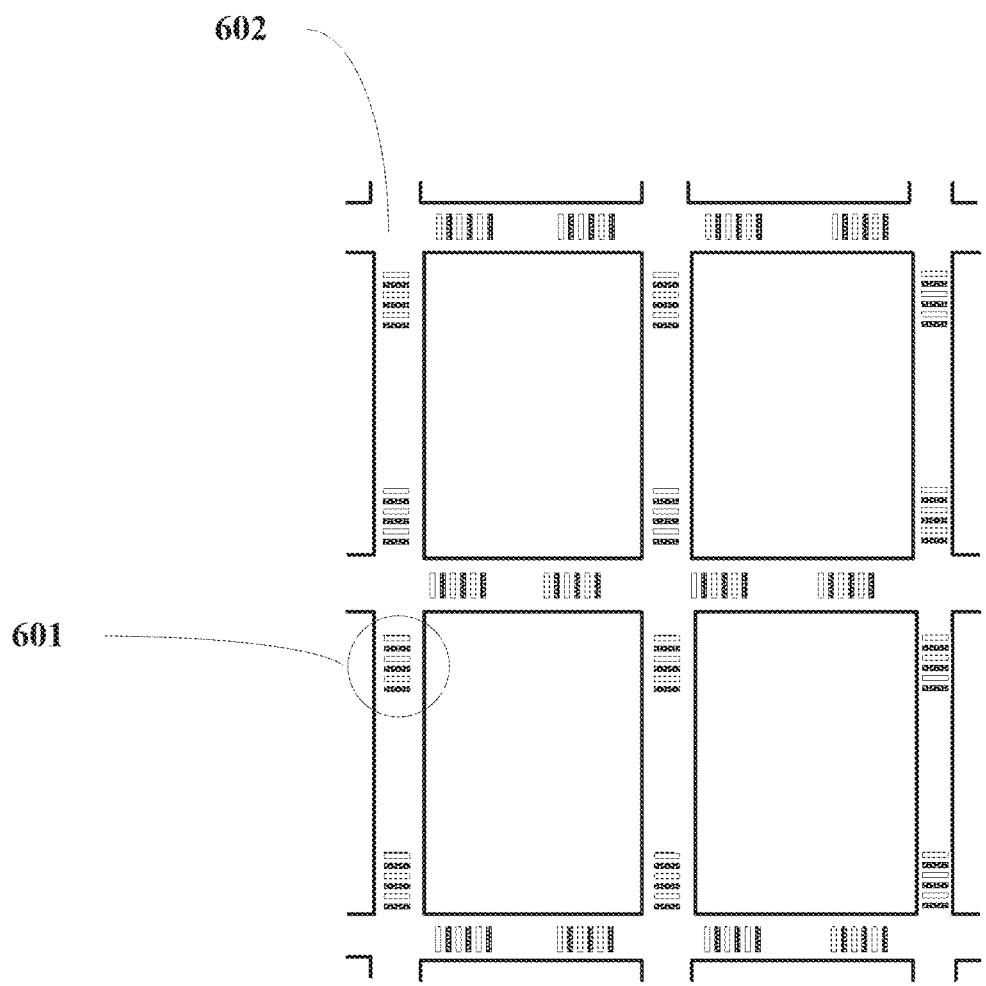
FIG. 6 is a plan view of a set of marks in a scribe line according to one embodiment of the present disclosure.

FIG. 6 is a plan view of one or more marks 601 disposed in a scribe line according to one embodiment of the present disclosure. Referring to FIG. 6, one or more marks 601 may be provided on a substrate such as in a scribe line 602 in the Y direction. Scribe line 602 may extend along the X direction and/or the Y direction. Marks 601 may be any one of the above-described marks, e.g., each of the marks may include the first stripe group having a plurality of first stripes and the second stripe group having a plurality of second stripes shown in FIG. 4. In the embodiment, each mark 601 may be configured such that, when a placement (position) error of the substrate is a first error, and a misalignment error of the center of the field of view of the detection unit with respect to the ideal center axis of scribe line 602 is a second error, the detection unit is operative to obtain data from the marks disposed in the scribe line. It will be appreciated that marks 601 may include a plurality of marks disposed in the Y direction or in the X direction, and each of the marks may include the first stripe group and the second stripe group.

In one exemplary embodiment, the scribe line has a width of 70 μm, the substrate placement error is 15 μm, the adjustment accuracy of the screw rod is 10 μm, the width of the field of view is 20 μm, the width of the mark may be set in the range between 40 μm and 70 μm. In this way, when the detection device is operative to detect a mark, only the detection unit is positioned within the adjustment accuracy error, and all the marks in a corresponding scribe line can be detected in one scanning operation. Thus, it is only necessary to perform a relatively coarse alignment to carry out efficient measurements without the need for precise alignment as required in the prior art approach, thereby greatly reducing the mark detection time, improving the detection efficiency and reducing the equipment accuracy requirement to lower the equipment cost.

With regard to the marks, some of the marks may have defects, e.g., undesirable particles or dust are present on the surface of the marks. In practical applications, the detection apparatus may be equipped with different types of detection units to detect defects of the marks or to prevent adverse effects of the mark defects on the detection. As an example, two structures of the detection unit will be described below.

Figure 7:
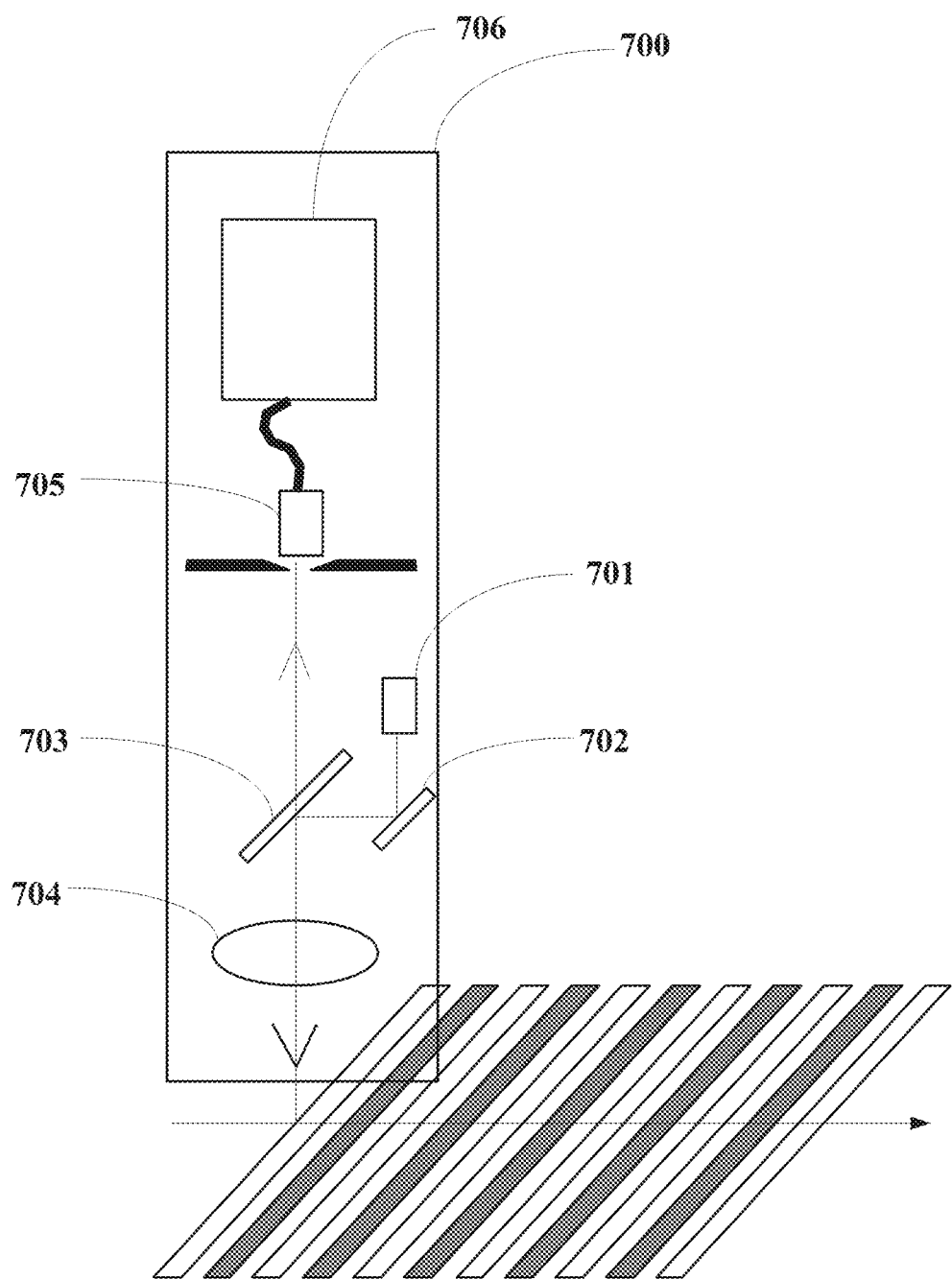
FIG. 7 is a side view in partial cross section of a structure of an optical image detection unit according to one embodiment of the present disclosure.

FIG. 7 is a schematic view of a structure of a detection unit according to one embodiment of the present disclosure. Referring to FIG. 7, the detection unit may include an optical detection system 700. In one embodiment, optical detection system 700 may include a light source 701, an optional mirror 702, a semi-transparent and semi-reflective mirror (alternatively referred to as beam splitter or semi-reflective mirror hereinafter) 703, a lens 704, and a transducer (e.g., a photodiode). Light source 701 may be, for example, a light emitting diode for generating light. Optional mirror 702 is configured to reflect light generated by light source 701. Semi-reflective mirror (beam splitter) 703 is configured to reflect at least one portion of light (e.g., light reflected by mirror 702) generated by light source 701 toward lens 704 to irradiate a mark on the substrate (first and second stripes 201, 202) and at least one portion of light emitted by the irradiated mark through lens 704. Lens 704 is configured to converge light from semi-reflective mirror 703 toward the mark and converge light emitted from the irradiated mark toward semi-reflective mirror 703 as an optical signal. Transducer 705 is configured to receive the optical signal through semi-reflective mirror 703 and convert the received optical signal into an electrical signal.

In one embodiment, the detection device may further include a data acquisition module 706 coupled to transducer 705 and configured to acquire or obtain the electrical signal of the transducer and send the acquired or obtained electrical signal to a processing device (not shown) for processing.

The detection unit shown in FIG. 7 may be used to irradiate the detection field with light (illuminating the detection field), and the detection unit can be moved along the horizontal direction indicated by an arrow (horizontal arrow pointing to the right). In general, for illuminating the detection field, light reflected of the surface of the irradiated mark back to the optical detection system has a relatively high light intensity, so that the field of view is generally well irradiated (illuminated). The illuminated detection field can recognize a mark based on the reflected light received from the surface of the mark. For marks that have no defects, light incident vertically to the marks will be substantially (or the majority of it) reflected back toward transducer (e.g., photodiode) 705, so that the detection unit can detect the marks based on the reflected light.

If the marks have defects, light incident onto the marks will be scattered, and the light intensity of the reflected light from the marks is relatively weak, so that defects of the marks can be detected. However, in this case, the presence of defects in the marks will affect, for example, the identification of the pitch between the stripes.

Figure 8:
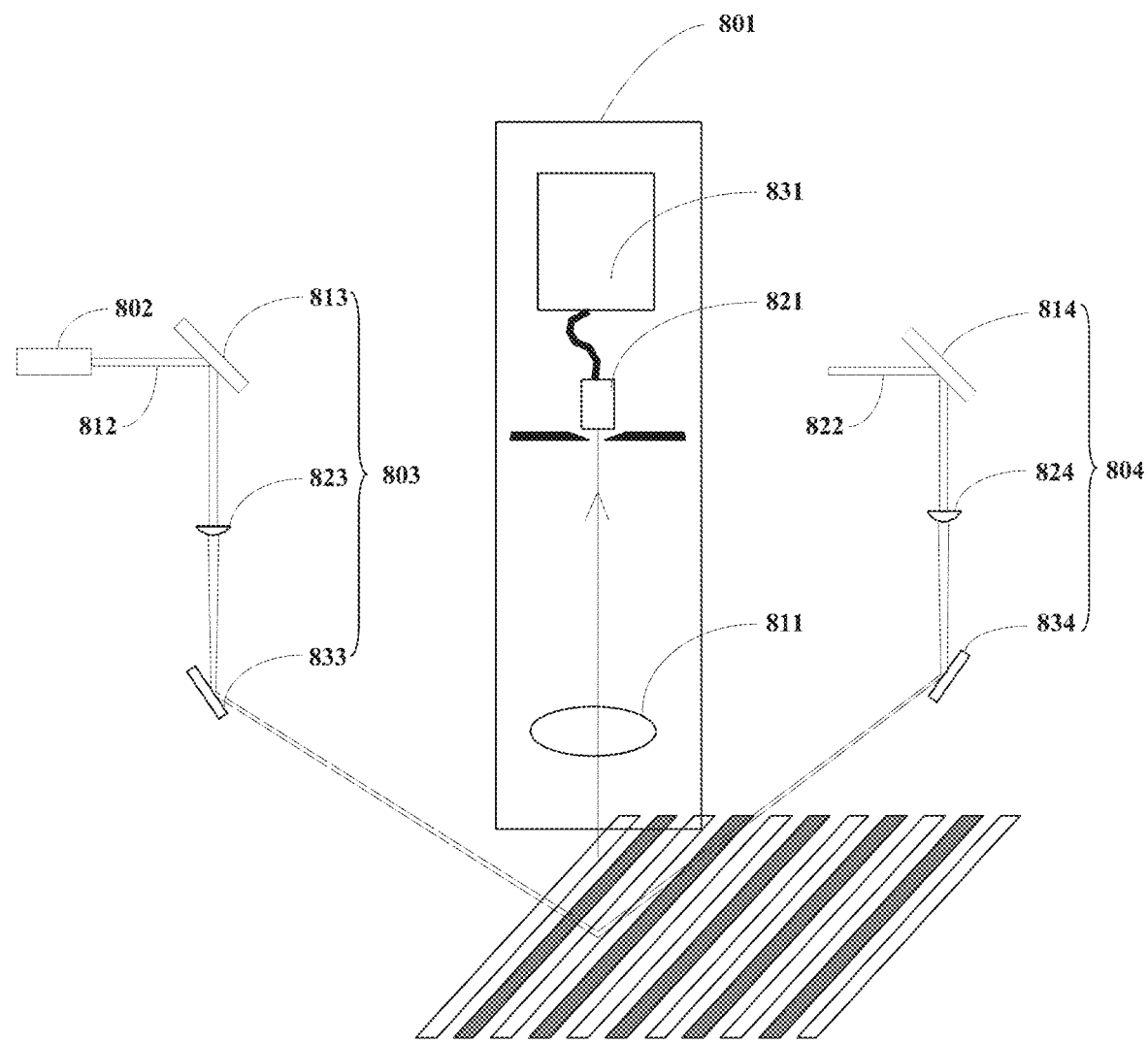
FIG. 8 is a side view in partial cross section of a structure of an optical image detection unit according to another embodiment of the present disclosure.

To overcome this problem, embodiments of the present disclosure also provide another detection unit. FIG. 8 is a schematic view of a structure of a detection unit according to another embodiment of the present disclosure. Referring to FIG. 8, the detection unit may include an optical detection system 801, a light source 802, a first light generation member 803 for generating first light, a second light generation member 804 for generating second light. These components will be described in detail below.

Optical detection system 801 includes a lens 811 and a transducer 821 (e.g., a photodiode). Lens 811 is configured to converge light emitted from marks and direct the converged light to transducer 821. Transducer 821 is configured to receive the converged light and convert the received light into an electrical signal.

Light source 802 is configured to generate a first light beam 812 and a second light beam 822.

First light generation member 803 is disposed on one side of optical detection system 801 and includes a first mirror 813, a first lens 823, and a second mirror 833. First mirror 813 is configured to reflect first light beam 812. First lens 823 is configured to converge the reflected first light beam. Second mirror 833 is configured to reflect the converged first beam as a first incident light onto the marks at a first oblique angle.

Second light generation member 804 is disposed on the other side of optical detection system 801 opposite first light generation member 803 and includes a third mirror 814, a second lens 824, and a fourth mirror 834. Third mirror 814 is configured to reflect second light beam 822. Second lens 824 is configured to converge the reflected second light beam. Fourth mirror 834 is configured to reflect the converged second beam as a second incident light onto the marks at a second oblique angle. In one embodiment, the first and second oblique angles have the same oblique angle.

In one embodiment, the detection apparatus may further include a data acquisition module 831 for acquiring the electrical signal of transducer 821 and transmit the acquired electrical signal to a data processing device for further processing.

The detection unit shown in FIG. 8 can be used for dark field detection. Under normal circumstances, when the incident light irradiates the marks at an oblique angle, the optical detection system cannot receive the reflected light or can only receive a small amount of light, the field of view is generally dark and is referred to as a dark field detection. And if the marks have defects, the incident light will be scattered, and the scattered light will be condensed by the lens. The transducer will pick up the condensed light, convert it to an electrical signal, and send the electrical signal to the processing module for further processing to detect defects of the marks. Further, the symmetrical position of the first and second light beams with respect to the detection unit can reduce the adverse effects on the detection results caused by the lens distortion.

In some embodiments, the detection apparatus may be provided with the detection unit shown in FIG. 7 for detecting a defect-free mark. In some other embodiments, the detection apparatus may be provided with the detection unit shown in FIG. 8 for detecting a defective mark. In further embodiments, a portion of the detection device may be provided with the detection unit shown in FIG. 7 and another portion of the detection device may be provided with the detection unit shown in FIG. 8 so as to operate in a complementary manner.

Thus, according to embodiments of the present disclosure, defects of a mark can be detected, and if the mark has defects, the desired data can still be obtained from the mark.

In summary, the structure of the detection device and the structure of the detection system including the substrate alignment device have been described in detail according to embodiments of the present disclosure.

FIG. 9A through 9F are state diagrams illustrating different stages in the process of detecting marks on a substrate using a detection system according to one embodiment of the present disclosure.

Figure 9A:
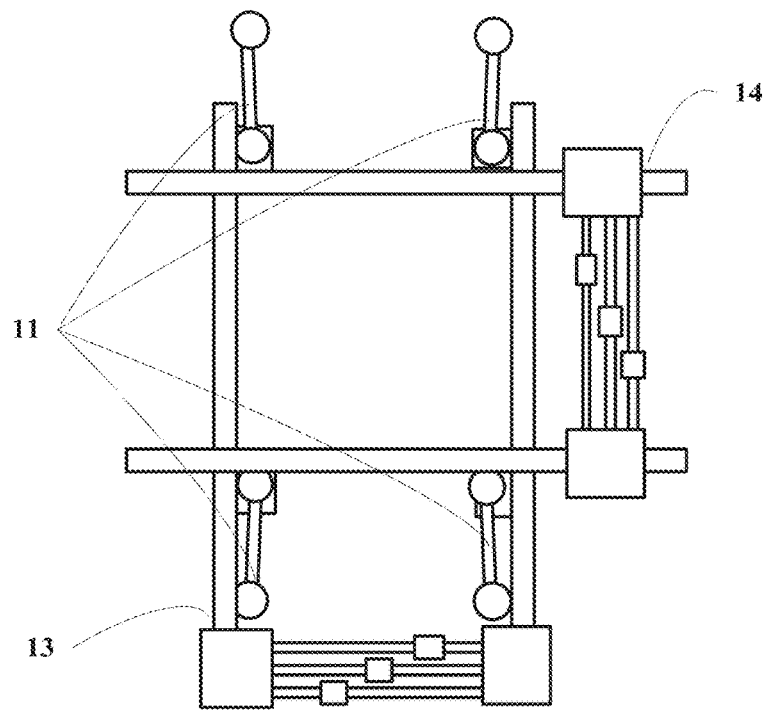
FIG. 9A through 9F are state diagrams illustrating the different stages in the process of detecting marks in a wafer using a detection system according to one embodiment of the present disclosure.

Referring to FIG. 9A, the detection system is in a standby or idle state.

Figure 9B:
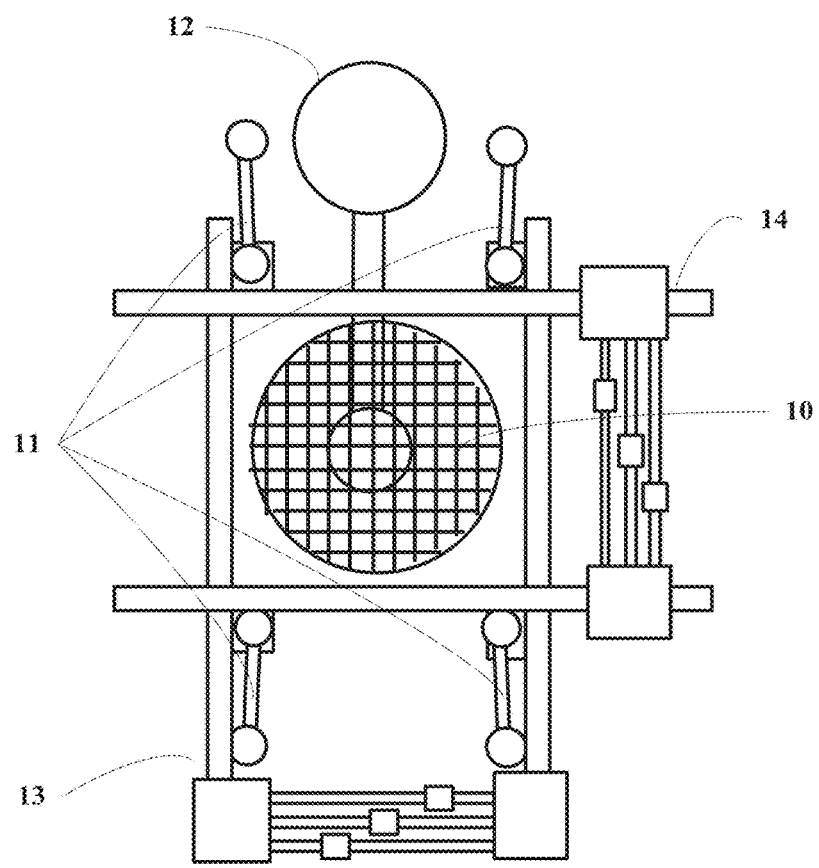

Next, referring to FIG. 9B, a substrate (e.g., wafer) 10 is conveyed into a substrate detection site by a multidimensional robot arm 12.

Figure 9C:
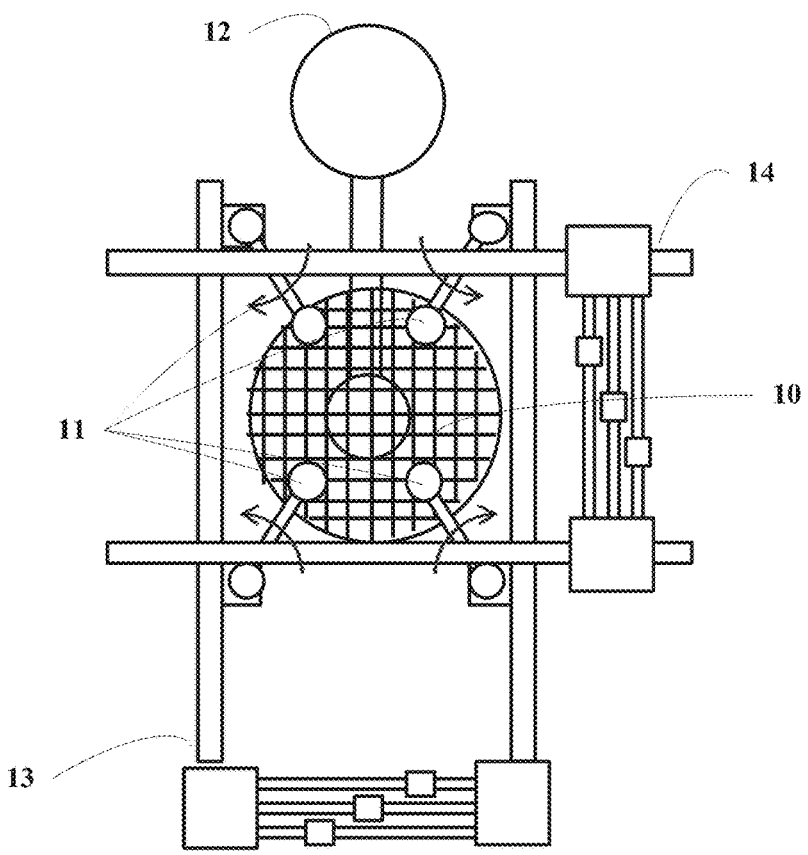

Next, referring to FIG. 9C, state detection units 11 each move from a standby position to a detection position to detect a positional state of substrate 10, multidimensional robot arm 12 adjusts substrate 10 in accordance with the positional state of substrate 10, so that the substrate is in the target position to enable the calibration of the substrate. As used herein, the term "target position" refers to two positions. The first position is the X, Y, Z location of the substrate within the plane defined by the substrate. The second position is the orientation, i.e., the orientation of the substrate with respect to rotation within the plane.

Figure 9D:
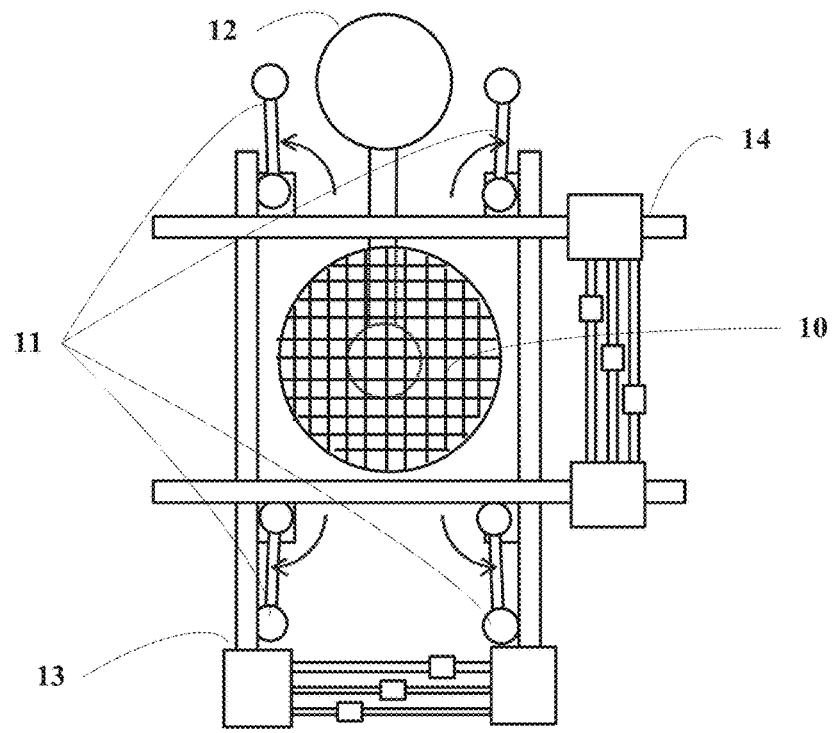

Next, referring to FIG. 9D, after the completion of the substrate calibration, state detection units 11 return back to their original standby position.

Figure 9E:
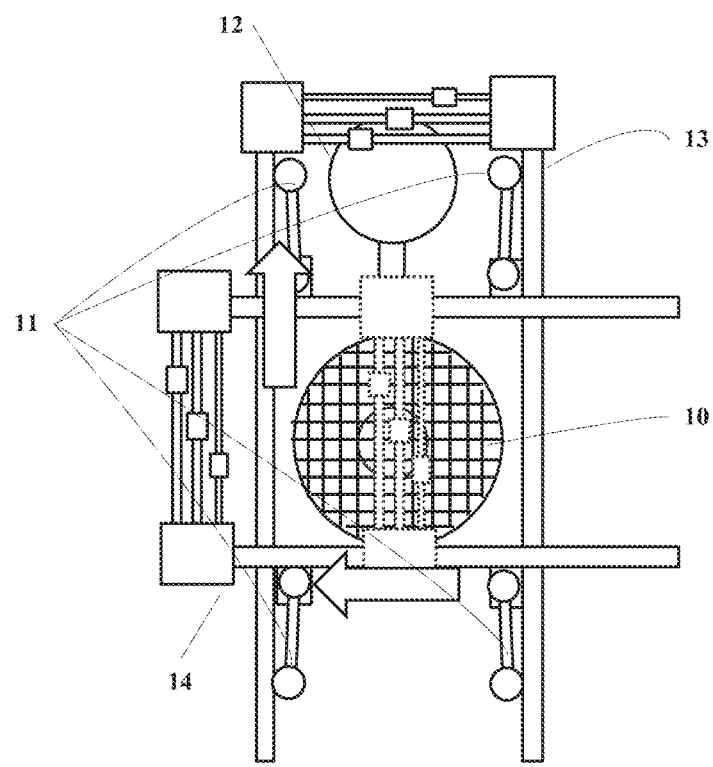

Next, referring to FIG. 9E, marks on the substrate are detected by a first detection device on first rail structure 13 and a second detection device on second rail structure 14, and overly marks are measured. For example, first overlay measurements are performed by slidably moving the first detection device along the first rail structure, and second overlay measurements are performed by slidably moving the second detection device along the second rail structure.

Figure 9F:
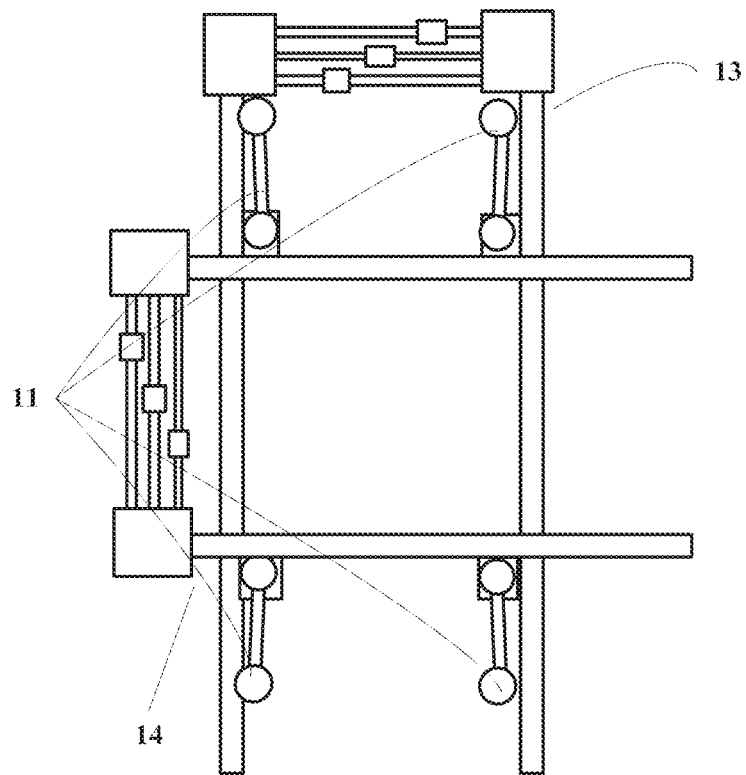

Next, referring to FIG. 9F, after performing the overlay measurements, substrate 10 may be conveyed out of the substrate detection site by multidimensional robot arm 12.

The embodiment enables the detection of the marks on the substrate. The calibration of the substrate by the substrate alignment device facilitates subsequent mark detection to improve the detection efficiency.

Embodiments of the present disclosure also provide a method for aligning a substrate. The method may include providing a plurality of state detection units, each of the state detection units is configured to move from a standby position to a detection position and return back from the detection position to the standby position. The method also includes detecting a positional state of the substrate using at least one of the state detection units. The method further includes receiving and supporting the substrate by a multidimensional robot arm, transferring the substrate by the multidimensional robot arm to a substrate detection site, and adjusting the substrate according to the detected positional state of the substrate to bring the substrate to a target position.

In one embodiment, the method also includes detecting a mark on the substrate by at least one detection device, the mark includes a first stripe group having a plurality of first stripes and a second stripe group having a plurality of second stripes, the first and second stripes are parallel to each other and spaced apart from each other. The method further includes obtaining data from the mark by moving the detection unit over and across the mark by a positioning unit. The method also includes processing the obtained data of the mark by a data processing module to determine a deviation of a relative position between the first stripe group and the second stripe group.

In one embodiment, the obtained data may include a light intensity associated with the first stripe group or the second stripe group, and a time at which the light intensity is received. In one embodiment, the method also includes determining a peak light intensity based on the received light intensity, and determining a time of occurrence of a current stripe based on the peak light intensity, determining a speed of the moving detection device based on the total length of the first stripe group or the second stripe group and the total time that the detection device traverses from a first stripe to the last stripe. The method also includes determining a position of the first stripe group and a position of the second stripe group and a positional difference between the first and second stripe groups based on the speed of the moving detection device and the time of occurrence of the current stripe.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A substrate alignment device, comprising:
a plurality of state detection units each configured to move from a standby position to a detection position for detecting a positional state of a substrate and return back from the detection position back to the standby position;
a multidimensional robot arm configured to:
receive and support the substrate;
transfer the substrate to a substrate detection site; and
adjust the substrate in at least one orientation according to the detected positional state of the substrate to position the substrate to a target position;
at least one rail structure comprising a pair of rails extending parallel to each other;
at least one detection device operative to move along the at least one rail structure to perform a mark detection on the substrate and comprising an optical system;
wherein adjust the substrate to the target position comprises:
bring at least one portion of the substrate into a detection field of view of the optical system of the at least one detection device; and
bring at least one portion of the substrate within an imaging target area of the optical system.

2. The substrate alignment device of claim 1, wherein:
the substrate is a semiconductor wafer;
the plurality of state detection units comprise at least one state detection unit configured to detect a position of an edge of the semiconductor wafer, and a remaining of the state detection units are configured to detect edges of the semiconductor wafer.

3. The substrate alignment device of claim 1, wherein the plurality of state detection units comprise four state detection units disposed at four vertices of a quadrilateral.

4. The substrate alignment device of claim 1, wherein the state detection units each comprise a photo sensor aligned with a portion of an edge of the substrate when the state detection units are in the detection position.

5. The substrate alignment device of claim 4, wherein the photo sensor comprises a light source for irradiating light onto the substrate and a light receiver for receiving light reflected from the irradiated substrate, and the photo sensors of the state detection units are disposed in a reference platform.

6. The substrate alignment device of claim 1, wherein the multidimensional robot arm is a six-degree-of-freedom arm configured to perform X-translation, Y-translation, Z-translation, X-Y plane rotation, X-tilt or Y-tilt operation of the substrate.

7. The substrate alignment device of claim 1, wherein the multidimensional robot arm comprises a support base for receiving and supporting the substrate;
the at least one rail structure is disposed above the support base and spaced apart from the support base.

8. The substrate alignment device of claim 1, wherein the at least one rail structure comprises a first rail and a second rail extending parallel to each other;
a first slider and a second slider mounted on the detection device, the first slider being slidable along the first rail, and the second slider being slidable along the second rail, so that the at least one detection device is slidably movable over and traversing across the substrate.

9. The substrate alignment device of claim 1, wherein the at least one rail structure is an air cushion guide, and during operation, an air cushion is formed between the detection device and the air cushion guide.

10. The substrate alignment device of claim 1, wherein:
the at least one detection device comprises a first detection device in an upper portion and a second detection device in a lower portion of the at least one detection device; and
the at least one rail structure comprises a first rail structure extending along a first direction for the first detection device and a second rail structure extending along a second direction for the second detection device.

11. The substrate alignment device of claim 10, wherein:
the first detection device is mounted to the first rail structure in a hanging manner; and
the second detection device is mounted to the second rail structure in a mounting manner.

12. The substrate alignment device of claim 10, wherein the first direction is perpendicular to the second direction.

13. A detection system, comprising:
a substrate alignment device comprising:
a plurality of state detection units each configured to move from a standby position to a detection position for detecting a positional state of a substrate and return back from the detection position back to the standby position;
a multidimensional robot arm configured to:
receive and support the substrate;
transfer the substrate to a substrate detection site; and
adjust the substrate in at least one orientation according to the detected positional state of the substrate to transport the substrate to a target position; and
at least one detection device configured to detect a plurality of marks on a surface of the substrate, the marks each comprising a first stripe group and a second stripe group disposed parallel to each other, the at least one detection device comprising:
at least one detection module operative to move over and traverse across the surface of the substrate in one direction and to obtain information from a corresponding mark, the at least one detection module operative to perform repeated acquisition operations on the first stripe group and the second stripe group of the corresponding mark to obtain data therefrom; and
at least one positioning unit configured to position the at least one detection module to align with the corresponding mark.

14. The detection system of claim 13, wherein the first strip group comprises a plurality of first stripes spaced apart from each other, and the second strip group comprises a plurality of second stripes spaced apart from each other;
the first and second stripes are disposed in the one direction.

15. The detection system of claim 14, wherein the first and second stripes are disposed alternatively to each other, and spaced apart from each other.

16. The detection system of claim 13, further comprising:
a data processing module coupled to the at least one detection device and configured to determine a deviation of a relative position between the first stripe group and the second stripe group based on the data obtained from the first stripe group and the second stripe group of the corresponding mark.

17. The detection system of claim 16, wherein the obtained data comprises one of a light intensity received from first stripe group or the second stripe group, and a time corresponding to the received light intensity; and
the data processing module is further configured to:
determine a peak light intensity based on the received light intensity;
determine a time of occurrence of a current stripe based on the peak light intensity;
determine a moving speed of the detection module based on a total length of the first stripe group or second stripe group and a total time that the detection module traverses from a first strip to a last stripe of the first stripe group or the second stripe group; and
determine a position of the first stripe group and a position of the second stripe group and a positional difference between the first and second stripe groups based on the moving speed and the time of occurrence of the current stripe.

18. The detection system of claim 13, wherein:
the substrate comprises a plurality of columns of the marks arranged in the one direction;
the at least one detection module comprises a plurality of detection modules;
the at least one positioning unit comprises a plurality of positioning units, each of the plurality of positioning units being configured to drive one of the plurality of detection modules to align the one of the plurality of detection modules with the corresponding mark.

19. The detection system of claim 13, wherein:
the at least one detection module comprises a frame;
the at least one positioning unit comprises:
at least one support rod fixedly mounted on the frame and configured to support the at least one detection module; and
a positioning structure configured to move the at least one detection module along the least one support rod to fix the at least one detection module at a desired position to align the at least one detection module with the corresponding mark.

20. The detection system of claim 19, wherein the at least one support rod comprises a screw rod; and the positioning structure drives the at least one detection module by the screw rod to move along the at least one support rod.

21. The detection system of claim 20, wherein:
the at least one detection module comprises first and second holes arranged vertically with respect to each other and a third hole disposed between the first and second holes, the third hole having internal threads, and the screw rod having external threads for engaging the internal threads of the third hole;
the frame comprises a first bracket and a second bracket disposed opposite to each other;
the at least one support rod comprises a first support rail passing through the first hole and a second support rail passing through the second hole and suspended between the first and second brackets; and
the screw rod passing through the third hole drives the at least one detection module along the first and second support rails when rotated.

22. A substrate alignment device, comprising:
four state detection units arranged in a quadrilateral formation along a periphery of a substrate, each of the four state detection units being configured to move from a standby position outside of the substrate to a detection position inside the substrate for detecting a positional state of a substrate and return from the detection position back to the standby position, and each of the four state detection units comprising a photo sensor aligned with an edge portion of the substrate when the four state detection units are in the detection position; and
a multidimensional robot arm configured to:
receive and support the substrate;
transfer the substrate to a substrate detection site; and
adjust the substrate in at least one orientation according to the detected positional state of the substrate to position the substrate to a target position.

* * * * *